United States Patent [19]

Partin

[11] Patent Number: 4,612,644
[45] Date of Patent: Sep. 16, 1986

[54] LEAD-ALLOY-TELLURIDE HETEROJUNCTION SEMICONDUCTOR LASER

[75] Inventor: Dale L. Partin, Sterling Heights, Mich.

[73] Assignee: General Motors Corporation, Detroit, Mich.

[21] Appl. No.: 754,171

[22] Filed: Jul. 12, 1985

[51] Int. Cl.$^4$ .......................... H01S 3/19; H01L 33/00
[52] U.S. Cl. ........................................ 372/44; 357/16; 357/17; 357/61; 372/45
[58] Field of Search ...................... 372/44, 45; 357/17, 357/61, 16

[56] References Cited

PUBLICATIONS

Partin et al., "Wavelength coverage of Lead-Europium-Selenide-Telluride Diode Lasers", *Applied Physics Letters*, 45(3), Aug. 1, 1984, pp. 193-195.
Partin, "Single Quantum Well Lead-Europium-Selenide-Telluride Diode Lasers", *Applied Physics Letters*, 45(5), Sep. 1, 1984, pp. 487-489.
Partin, "Lead-Europium-Selenide-Telluride Grown by Molecular Beam Epitaxy", *Journal of Electronics Materials*, vol. 13, No. 3, 1984.
Weber et al., "Waveguide and Luminescent Properties of Thin Film Pb-Salt Injection Lasers", *Journal Applied Physics*, vol. 44, No. 11, Nov. 1973, pp. 4991-5000.

*Primary Examiner*—James W. Davie
*Assistant Examiner*—Georgia Y. Epps
*Attorney, Agent, or Firm*—Randy W. Tung

[57] ABSTRACT

A double heterojunction lead salt infrared diode laser having an active region layer of a lead salt semiconductor of a given lattice constant, energy band gap, and index of refraction. The active region layer is sandwiched between two lead salt semiconductor layers containing calcium and one element selected from the group consisting of europium and strontium that are mutually of opposite conductivity type and have substantially the same lattice constant as the active region layer. In addition, the two outside layers have an energy band gap greater than the active region layer and an index of refraction less than the active region layer. The resulting laser has lattice matching, as well as enhanced carrier confinement and optical confinement.

3 Claims, 1 Drawing Figure

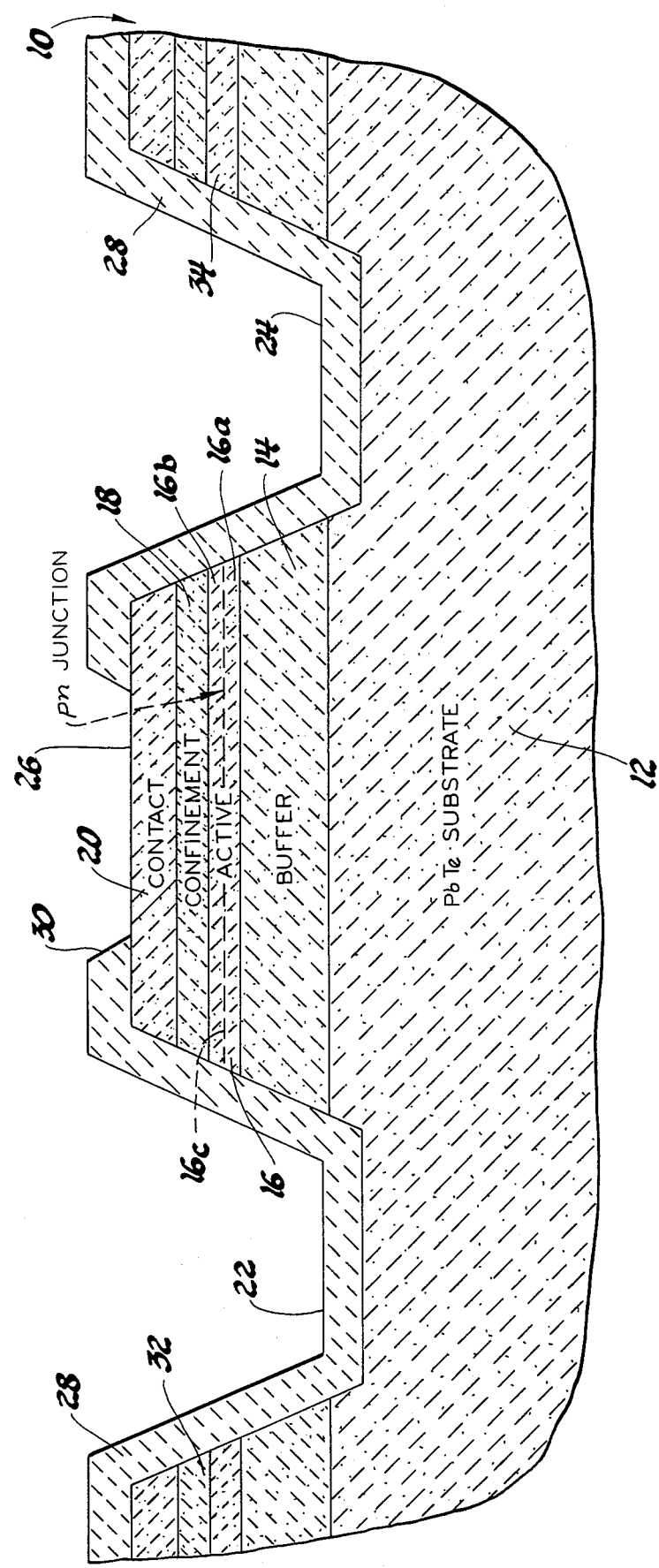

LEAD-ALLOY-TELLURIDE HETEROJUNCTION SEMICONDUCTOR LASER

FIELD OF THE INVENTION

This invention generally relates to improved double heterojunction lead salt semiconductor infrared diode lasers. It more particularly involves long wavelength infrared lasers having a lead chalcogenide active layer sandwiched between two lead chalcogenide layers that contain calcium/europium or calcium/strontium and that are lattice matched and of higher band gap energy.

BACKGROUND OF THE INVENTION

A semiconductor diode laser is a monocrystalline pn junction device. In one form of such a device, the pn junction is a plane disposed in an active region between two parallel rectangular faces of a monocrystalline semiconductor body. Two mutually parallel reflective faces that are perpendicular to the pn junction form a laser cavity. Lasing action is produced by applying a forward voltage across the pn junction. The forward bias injects electrons and holes across the pn junction. Electrons and holes recombine in the active region to cause stimulated emission of the radiation. Above a given level of electron injection, called the threshold current ($I_{TH}$), emitted radiation is collected and amplified in the active region. The amplified radiation exits the active region parallel the pn junction as a monochromatic beam.

A problem is that electrons and holes can be injected into the active region without stimulating emission therein. For example, they can escape outside the active region to adjacent portions of the semiconductor body, where they recombine without contributing to laser emission. Analogously, photons produced in the active region can escape from the active region by radiation in a direction not parallel the pn junction. In addition, it is possible for electrons to disappear within the active region without producing the desired emission of radiation, such as by combining with holes at crystal defects. All such losses reduce laser efficiency, i.e., output power. One can resist escape of injected electrons and holes and stimulated photons from the active region by sandwiching the active region between two contiguous layers of monocrystalline semiconductive material having a larger energy band gap and a lower index of refraction than the active region. Such layers serve to confine electrons, holes and photons to the active region. On the other hand, the active region, and as a practical matter the two contiguous layers must be of a very high monocrystalline quality. This requires that these layers and the active region be closely matched not only in crystal structure but also in crystal lattice size. Moreover, one of the sandwiching layers must be doped to n-type conductivity and the other to p-type conductivity. Such a structure is referred to herein as a double heterojunction semiconductor diode laser.

Lead chalcogenide double heterojunction semiconductor diode lasers which operate at high temperatures have been difficult to make. By high temperature I mean higher than about 100 K. under continuous wave (CW) operation. I have previously filed U.S. patent application Ser. No. 565,397 on a quaternary semiconductive diode laser system based on an alloy of lead-europium selenide-telluride which permits such lasers to be made with relative ease.

OBJECTS AND SUMMARY OF THE INVENTION

It is therefore a principal object of this invention to provide a lead salt semiconductor diode laser that can be operated at relatively high operating temperatures.

Another object of the invention is to provide an improved lead-alloy chalcogenide salt heterojunction infrared diode laser.

Still another object of the invention is to provide a heterojunction diode laser having a lead-telluride, lead-tin-telluride, lead-europium-calcium-telluride, or lead-strontium-calcium-telluride active region and lead-europium-calcium-telluride or lead-strontium-calcium-telluride confining regions.

In substance, this invention recognizes that the inclusion of small amounts of europium/calcium or strontium/calcium in a lead or lead-tin-telluride composition can significantly increase the energy band gap and decrease the index of refraction. This invention also recognizes that small amounts of europium and/or strontium increase the crystal lattice constant. This invention further recognizes that calcium reduces the crystal lattice constant without reducing energy band. Moreover, this invention recognizes that even though appreciable proportions of lead and/or tin are replaced by europium, strontium or calcium, the resultant semiconductor can still be heavily doped to both n-type and p-type conductivity. In addition, abrupt heterojunctions can be made because europium, calcium, and strontium have low diffusion constants in lead telluride. These attributes are very important to a double heterojunction lead salt infrared diode laser such as that shown in the drawing.

BRIEF DESCRIPTION OF THE DRAWING

Other objects, features and advantages of the invention will become more apparent from the following description of preferred embodiments thereof and from the drawing which shows a fragmentary sectional view of a lead salt semiconductor diode laser element made in accordance with this invention.

DESCRIPTION OF THE PREFERRED EMBODIMENTS

The invention comprehends an infrared double heterojunction lead salt diode laser having a lead-europium-calcium-telluride, or a lead-strontium-calcium-telluride confinement region layer. In a specific example one can also use such compositions, with low to moderate europium/calcium or strontium/calcium content in the active region layer. In all cases the most abundant constituents of these lead-metal element-calcium-tellurides are lead and tellurium. Alternatively, I may also add tin in the active region layer to make a longer emission wavelength laser. The active region layer is sandwiched between an upper n-type confinement layer and a lower p-type buffer layer, both of which are lattice-matched lead-europium-calcium-telluride, or lead-strontium-calcium-telluride layers. The buffer layer is also a confinement layer, as is usual in a double heterojunction diode laser structure. The confinement and buffer layers have a larger concentration of europium/calcium or strontium/calcium than the active region layer, and therefore, have a larger energy band gap and a lower index of refraction. However, both the confinement layer and the buffer layer have an identical crystal structure to that of the active region layer and substantially the same lattice constant. In a preferred example, all three layers are epitaxially grown on a high quality lead-telluride substrate and are of substantially the same lattice constant. They are covered with an epitaxially deposited contact layer of lead telluride, which is of the same lattice constant. In using this invention to make a relatively long wavelength embodiment, emitting light at wavelengths longer than approximately 6 microns, the substrate, active region layer, and contact layer are of lead-tin telluride lattice-matched to the confinement and buffer layers.

The drawing illustrates a semiconductor diode laser element 10 made on a 0.5 millimeter thick monocrystalline lead telluride (PbTe) substrate 12. Substrate 12 has a p-type doping of about $2 \times 10^{19}$ atom per cubic centimeter. As is normal for such compositions, the crystal structure is face centered cubic and the lattice constant is about 6.460 angstroms. The drawing shows a fragment of substrate 12 in section across mesas on its surface. The fragment shown includes an entire mesa in a central portion and portions mesas 32 and 34 on each side of the central mesa. The central mesa contains a laser cavity, and is as hereinafter described. As is usual, side mesas 32 and 34 are only present because they are incidentally formed in the laser element manufacturing process. Thus, they are no more important to this invention than they are to any other semiconductor diode laser structure.

The structure in the drawing is made by epitaxially depositing a blanket semiconductive layer 14 of $Pb_{1-x-y}Eu_xCa_yTe$ or $Pb_{1-x-y}Sr_xCa_yTe$ onto the lead telluride substrate 12. The values of x and y for $Pb_{1-x-y}Eu_xCa_yTe$ or $0 < x \leq 0.05$ and $0 < y \leq 0.15$. The values of x and y for $Pb_{1-x-y}Sr_xCa_yTe$ are $0 < x,y \leq 0.15$. It can be seen that semiconductive lead salt layer 14 differs from the lead salt substrate 12 in that it also contains europium/calcium or strontium/calcium. Even though semiconductive layer 14 contains europium/calcium or strontium/calcium, it still is monocrystalline and has a face centered cubic crystal structure with a lattice constant of about 6.460 angstroms. In addition, it is of p-type conductivity, having a heavy p-type dopant concentration of approximately $5 \times 10^{18}$ atoms per cubic centimeter. Thus, the interface between layers 14 and substrate 12 presents no significant electrical resistance. The europium/calcium or strontium/calcium containing lead chalcogenide layer 14 is most importantly an electron, hole and photon confinement layer for the active layer 16 that is over it. As such, it should be at least about 1-2 micrometers thick. However, layer 14 also serves as a buffer layer for layer 16. To serve the latter purpose as well, layer 14 is grown to a thickness of about 5 microns. By buffer layer I mean that layer 14 is grown to a sufficient thickness to a least partially mask crystals imperfections that may arise at its interface with the substrate 12. Such a thickness and purpose is not new, nor more critical to this invention than any other lead salt laser. In any event, a thickness of at least about 3 microns is generally needed to perform the buffering function. Generally, there is not much improvement in the buffering function with thicknesses above 6 microns.

A blanket epitaxial layer 16 of $Pb_{1-x-y}Eu_xCa_yTe$ ($0 \leq x < 0.02$, $0 \leq y < 0.05$) or $Pb_{1-x-y}Sr_xCa_yTe$ ($0 \leq x,y < 0.05$) semiconductive material is then grown on top of the europium/calcium or strontium/calcium containing semiconductive layer 14. It is monocrystalline and of face centered cubic crystal structure, having a lattice constant of about 6.460 angstroms. The concentrations of europium, strontium, or calcium in layer 16 is approximately two-thirds that of the same in buffer layer 14 and confinement layer 18. This change in concentration produces a change in energy band gap and index of refraction hereinbefore referred to.

Additions of Eu or Sr and Ca increase the energy band gap of PbTe. However, the ratio of Eu to Ca or Sr to Ca concentrations must be adjusted to maintain the same crystal lattice constant as the lead telluride substrate has (i.e., 6.460 Å). If a lead-tin-telluride active layer is to be used for a longer emission wavelength laser, it will have a lattice constant which is dependent on its tin concentration and is smaller than 6.460 Å. In this case, the buffer and confinement layers would have additional calcium so that their lattice constants were equal to that of the active layer. Alternatively, for a $Pb_{1-z}Sn_zTe$ active layer $(Pb_{1-z}Sn_z)_{1-x-y}Eu_xCa_yTe$ or $(Pb_{1-z}Sn_2)_{1-x-y}Sr_xCa_yTe$ could be used in the buffer and confinement layers with approximately the same ratio of Eu (or Sr) to Ca concentrations used for lattice-matching to lead telluride substrates.

The lower portion 16a of semiconductive layer 16 is doped to p-type conductivity, having a p-type impurity concentration of about $1 \times 10^{17}$ to $1 \times 10^{18}$ atoms per cubic centimeter. The upper portion 16b of layer 16 is doped to n-type conductivity, having an n-type impurity concentration of about $1 \times 10^{17}$ to $1 \times 10^{18}$ atoms per cubic centimeter. The interface between the n-type layer upper portion 16b and the p-type layer lower portion 16a forms a pn junction 16c. Layer 16 thus comprises the laser active region. For ease of identification of this layer as compared to the other layers, I refer to this entire layer 16 as the active region layer. Alternatively, the entire active region may be of n-type or p-type conductivity with an impurity concentration of about $1 \times 10^{17}$ to $1 \times 10^{18}$ atoms per cubic centimeter.

A blanket epitaxial layer 18 of n-type $Pb_{1-x-y}Eu_xCa_yTe$ or $Pb_{1-x-y}Sr_xCa_yTe$ is disposed on the upper surface of the active layer 16. This layer 18 is a second, or upper, europium/calcium or strontium/calcium containing semiconductive lead chalcogenide layer that is similar in composition and properties to the lower lead chalcogenide semiconductive layer 14, except for a difference in doping. The upper europium/calcium or strontium/calcium containing lead chalcogenide semiconductor layer 18 is heavily doped to n-type conductivity by containing an n-type impurity concentration of about $2 \times 10^{18}$ to $1 \times 10^{19}$ atoms per cubic centimeter. Like the lower lead chalcogenide semiconductor layer 14, the upper europium/calcium and strontium/calcium containing lead chalcogenide semiconductor layer 18 has a face centered cubic crystal lattice having a lattice constant of about 6.460 angstroms. Both of layers 14 and 18 have an energy band gap ($E_g$) that is higher and an index of refraction that is lower than that of the active region layer 16. Hence, they can provide both carrier and optical confinement.

The thickness of confinement layer 18 and active region layer 16, including its portions 16a and 16b, are the same in this invention as they would be in other semiconductor diode lasers. For example, I prefer that the active region layer 16 and the confinement layer 18 each of about 1-2 micrometers thick. As with any other heterojunction semiconductor diode lasers, layer 18 should have a thickness of at least about 0.1 micrometer in order to significantly confine electrons and holes. I doubt that there is much benefit in having the confinement layer 18 be appreciably thicker than about 3 micrometers. In fact, if it is too thick, it will impede heat flow away from the pn junction 16c. It should be remembered, of course, that lead salt semiconductors are not particularly heat conductive. In view of this, one ordinarily wishes to have junction 16c be as close to the upper surface 26 of the laser element 10 as is practical, because a heat sink (not shown) is affixed to that surface.

In addition, in order to insure that a durable, low resistance ohmic contact can be obtained on the upper surface of the device, a final upper semiconductive layer 20 is epitaxially deposited onto the confinement layer 18. The upper layer 20 is of lead telluride (PbTe). It is a semiconductive monocrystalline layer having the same face centered cubic crystal structure and lattice constant of 6.460 angstroms as the underlying layers. It is heavily doped to n-type conductivity, by having an n-type impurity concentration of about $1 \times 10^{19}$ atoms per cubic centimeter.

Layer 20 has a thickness of about 0.05–2 micrometers. If this layer 20 is to be used at all, i.e., to enhance contact information, it should have a thickness at least large enough to provide a continuous coating. On the other hand, it should not be so thick as to provide a significant thermal resistance between the pn junction 16c and the upper surface 26 of the laser element, where heat is ordinarily withdrawn to cool the laser. Accordingly, I would not want the layer 20 to be appreciably more than 2 micrometers thick.

Ordinarily, a laser such as shown in the drawing is fabricated by initially blanket depositing its various layers onto a substrate and then surface etching the resultant product to define the lasing mesa, i.e., the central mesa in the drawing. I contemplate making my laser similarly. For example, after layers 14, 16, 18 and 20 are epitaxially deposited, parallel grooves 22 and 24 are etched into the upper surfaces 26 of the wafer, preferably down through all of the layers and into the surface of the substrate 12. The length, width and depth of the grooves, as well as their side wall angle with surface 26, are no more material to this invention than they are to any other double heterojunction semiconductor infrared diode laser. For purposes of providing a specific example, they should be wide enough apart to provide a width on upper surface 26 of the central mesa of about 3–40 micrometers, preferably 3–15 micrometers. The length of upper surface 26 should be about 150–600 micrometers, preferably 400 micrometers. The width of grooves 22 and 24 is not especially critical either. Then the entire upper surface 26 is anodized, including the surfaces within the grooves 22 and 24, to form a native oxide coating 28.

A rectangular contact window 30, extending substantially along the entire length of the upper surface 26, is opened in anodic oxide coating 28 by photoetching techniques, so that a low resistance ohmic contact can be made along the entire upper surface 26 of the upper layer 20. The coated substrate is then cut along the side mesas 32 and 34 to provide an elongated body having a central mesa for lasing. The ends of the substrate 12 are then cleaved in the normal and accepted manner, to provide a laser cavity in the central mesa. Low resistance electrical contacts can be made to n-type surface 26, and to the p-type backside (not shown) of substrate 12 in any normal and accepted manner for making contacts to PbTe. For example, they can be made in the same manner previously described in Wayne Lo's U.S. Pat. No. 4,350,990, which is entitled "Electrode for Lead-Salt Diodes" and which is incorporated herein by reference.

Dopants used in the substrate 12 and the various layers 14, 16, 18 and 20 can be the same as those conventionally used in making any lead salt semiconductor diode laser. As for example, one can dope to n-type conductivity by using an excess of lead in the semiconductor composition or by including appropriate quantities of bismuth, copper or cadmium atoms in the layer. They can be included as grown, by ion implantation, or by diffusion. Analogously, p-type doping can be done by adding an excess of tellurium or by including thallium, silver, sodium or potassium in the semiconductor composition. Normally, one would want to use a dopant that has a very low diffusion constant to insure that the pn junction 16c is not only abrupt as formed but remains so during use. Accordingly, in most instances, it is preferred to dope the various layers as formed rather than subsequently by diffusion. I prefer to use bismuth as the n-type dopant and thallium as the p-type dopant.

A significant feature of my invention is that it can be used to form a large optical cavity single quantum well laser with continuous wave (CW) mode operation well over 100 K. and pulsed operation over 200 K. These lasers may have about 200–1000 angstrom regions disposed within about a 3 micron wide optical cavity. Hence, single or multiple quantum well devices with large optical cavities or graded index optical confinement may be constructed. In these lasers, a 600 angstrom thick layer of lead telluride forms the active region. A pn junction separated opposite faces of this layer. The active region layer is sandwiched between mutually opposite conductivity type $Pb_{1-x-y}Eu_xCa_yTe$ or $Pb_{1-x-y}Sr_xCa_yTe$ layers lattice-matched to PbTe. They each are about 1–2 micrometers thick. The interface of these layers with the active region layer defined the quantum well. These layers are referred to herein as carrier confinement layers. They were, in turn, sandwiched between about 1.5–2 micrometers thick mutually opposite conductivity type $Pb_{1-x-y}Eu_xCa_yTe$ or $Pb_{1-x-y}Sr_xCa_yTe$ layers lattice-matched to PbTe. These latter two layers serve to confine photons. The interface of these optical confinement layers with the carrier confinement layers defined an optical cavity. In the completed device the optical confinement layers are, in turn, sandwiched between a PbTe substrate and a covering PbTe layer, of mutually opposite conductivity type. Thus, the structure is analogous to that shown in the drawing but contains still another pair of confinement layers, specifically for optical confinement.

The embodiments of the invention in which an exclusive property or privilege is claimed are defined as follows:

1. In a double heterojunction semiconductor lead salt infrared diode laser, the improvement wherein a semiconductive monocrystalline lead salt active region layer of given energy band gap, index of refraction, crystal structure and lattice constant is sandwiched between two semiconductive monocrystalline lead salt layers of mutually opposite conductivity type containing calcium and one element selected from the group consisting of europium and strontium and having an energy band gap significantly higher than, an index of refraction significantly lower than, a crystal structure the same as, and a lattice constant substantially equal to the active region layer, effective to increase laser performance by providing lattice matching among said layers as well as providing at least carrier confinement with respect to the active region layer.

2. In a large optical cavity quantum well semiconductor infrared diode laser exhibiting current carrier and optical confinement for its active region layer but also exhibiting increased operating temperature due to close lattice matching of face centered cubic monocrystalline layers forming the double heterojunctions, said laser comprising a monocrystalline buffer layer of a given conductivity-type lead salt semiconductor containing calcium and an element selected from the group consisting of europium and strontium that has an energy band gap greater than, an index of refraction lesser than, and a lattice constant substantially equal to predetermined values, a monocrystalline active region layer on the buffer layer of a lead salt semiconductor containing a pn junction that has said predetermined energy band gap, index of refraction and lattice constant, and a confinement layer on the active region layer of an opposite conductivity type lead salt semiconductor containing lesser amounts and smaller proportions of calcium and one element selected from the group consisting of europium and strontium that has an energy band gap greater than, an index of refraction smaller than, and a lattice constant substantially equal to said predetermined values.

3. In a double heterojunction semiconductor long wavelength infrared diode laser, the improvement wherein a lead-tin telluride monocrystalline semiconductive active region layer of given energy band gap, index of refraction, and lattice constant is sandwiched between two lead-metal element-calcium-telluride monocrystalline semiconductor layers that may also contain tin, that are of mutually opposite conductivity type, and have an energy band gap significantly higher than, and a lattice constant substantially equal to the lead-tin telluride active layer, effective to increase laser performance by providing lattice matching among said layers as well as providing carrier and optical confinement to the active region layer, said metal element is selected from the group consisting of europium and strontium.

* * * * *